(12) United States Patent
Ide et al.

(10) Patent No.: US 7,113,658 B2
(45) Date of Patent: Sep. 26, 2006

(54) OPTICAL MODULE, AND OPTICAL TRANSMISSION DEVICE

(75) Inventors: Tsugio Ide, Nagato-machi (JP); Yusuke Aritake, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/934,381

(22) Filed: Sep. 7, 2004

(65) Prior Publication Data
US 2005/0084218 A1   Apr. 21, 2005

(30) Foreign Application Priority Data
Sep. 8, 2003   (JP) .............................. 2003-315578

(51) Int. Cl.
*G02B 6/36* (2006.01)
(52) U.S. Cl. ............................. 385/11; 385/14; 385/39; 385/49
(58) Field of Classification Search ................. 385/39, 385/49, 11, 14
See application file for complete search history.

(56) References Cited

U.S. PATENT DOCUMENTS

| | | | |
|---|---|---|---|
| 5,359,447 A | 10/1994 | Hahn et al. | |
| 5,748,369 A * | 5/1998 | Yokota | ........................ 359/487 |
| 6,023,450 A * | 2/2000 | Park et al. | ................... 369/121 |
| 6,069,905 A | 5/2000 | Davis et al. | |
| 6,327,037 B1 * | 12/2001 | Chou et al. | ................... 356/484 |
| 6,330,377 B1 | 12/2001 | Kosemura | |
| 6,567,437 B1 * | 5/2003 | Imaki et al. | ................... 372/32 |
| 6,687,268 B1 | 2/2004 | Kitamura et al. | |
| 6,931,187 B1 * | 8/2005 | Kim et al. | ................... 385/124 |
| 2005/0088716 A1 * | 4/2005 | Kozlovsky et al. | ......... 359/237 |

FOREIGN PATENT DOCUMENTS

| | | |
|---|---|---|
| JP | 04-121771 | 10/1992 |
| JP | 4-121771 | 10/1992 |
| JP | A 7-170231 | 7/1995 |
| JP | A-2000-81524 | 3/2000 |
| JP | 2000-323791 | 11/2000 |
| JP | A-2002-368334 | 12/2002 |
| WO | WO 99/34487 A1 | 7/1999 |
| WO | WO 01/91257 A2 | 11/2001 |

OTHER PUBLICATIONS

Chua et al., "Anisotropic apertures for polarization-stable laterally oxidized vertical-cavity lasers," *Applied Physics Letters*, vol. 73, No. 12, pp. 1631-1633, Sep. 1998.

Claisse et al., "Automatic power control of a VCSEL using an angled lid T056 package," *Electronic Components & Technology Conference*, Seattle, WA, pp. 203-209, May 1998.

* cited by examiner

*Primary Examiner*—Sung Pak
*Assistant Examiner*—James D. Stein
(74) *Attorney, Agent, or Firm*—Oliff & Berridge, PLC

(57) ABSTRACT

To provide optical modules and optical transmission devices that are suitable for communication forms using multimode optical fibers, an optical module includes a surface-emitting type semiconductor laser that emits polarized light oscillating in a multimode which is preferentially oriented in two given polarization axes, and an optical member that demonstrates at least one function among a transmission function, a reflection function, a refraction function, and a diffraction function alternatively to a predetermined polarization. The optical member is disposed such that a principal plane thereof intersects with a traveling direction of emission light of the surface-emitting type semiconductor laser and a polarization axis of the polarization plane does not overlap with the polarization axes of the emission light of the surface-emitting type semiconductor laser.

13 Claims, 7 Drawing Sheets

OPTICAL MODULE, AND OPTICAL TRANSMISSION DEVICE

BACKGROUND OF THE INVENTION

1. Field of Invention

Exemplary aspects of the present invention relate to optical modules and optical transmission devices having a vertical-cavity surface-emitting laser (VCSEL).

2. Description of Related Art

In related art optical fiber communications systems, multimode optical fibers that have a larger core diameter than that of singlemode optical fibers and provide easy optical coupling with a light source are often used in short distance data communications up to about several hundred meters, and referred to as LAN (Local Area Network) and SAN (storage area network).

When communicating with a multimode optical fiber, degradation of the S/N ratio called mode selection loss poses a problem. In order to enhance mode selection loss, in the related art, the use of a light source whose emission light has a low coherence is effective. For example, according to Laid-open Patent Application HEI 7-170231, transmission distance of several hundred meters is secured in high-speed data communications at 1.5 Gbps or more by using a VCSEL (vertical-cavity surface-emitting laser) of a multimode oscillation as a light source.

SUMMARY OF THE INVENTION

However, in a VCSEL of a multimode oscillation, the direction of polarization may differ for every oscillation mode. When an optical device having polarization selectivity is present in a transmission path, fluctuations may occur in the amount of light that passes through (or reflects on) the optical device due to a mode competition of the emission light from the VCSEL, and there is a possibility of causing the fall of the S/N ratio. For this reason, development of a light source which can obtain signal light with good noise tolerance in various communication forms using multimode optical fibers is desired.

Exemplary aspects of the present invention provide optical modules and optical transmission devices that are suitable for communication forms using multimode optical fibers.

Exemplary aspects of the present invention relate to an optical module including: a surface-emitting type semiconductor laser that emits polarized light oscillating in a multimode which is preferentially oriented in two given polarization axes; and an optical member that demonstrates at least one function among a transmission function, a reflection function, a refraction function, and a diffraction function alternatively with respect to a predetermined polarization, the optical member being arranged such that a principal plane thereof intersects with a traveling direction of emission light of the surface-emitting type semiconductor laser, and the surface-emitting type semiconductor laser being arranged such that the two polarization axes of emission light do not overlap with a polarization axis of the optical member.

In an exemplary aspect of the present invention, being preferentially oriented to a certain polarization axis means that there exists a polarization axis with a larger amount of output light compared with other polarization axes. Moreover, a multimode oscillation means that a transverse mode of emission light oscillates not only in a basic (0-th order) mode but in a first order or higher order mode.

In accordance with an exemplary aspect of the present invention, because the surface-emitting type semiconductor laser oscillates in a multimode, its emission light has a low coherence, and degradation of the S/N ratio due to mode selection loss is few even when a multimode fiber is used. Furthermore, since two polarization axes preferentially oriented to the polarization directions of emission light of the surface-emitting type semiconductor laser are arranged in a manner so as not to overlap with a polarization axis of the optical member, fluctuations in the amount of light that travels via the optical member (thereby being subject to an action of transmission, reflection, refraction, or diffraction) are few. For this reason, in accordance with an exemplary aspect of the present invention, a light source with low noise, which is suitable for communication forms using multimode fibers, can be realized.

An optical module in accordance with an exemplary aspect of the present invention may include a photodetector that receives at least a part of emission light of the surface-emitting type semiconductor laser, the optical member reflecting, refracting or diffracting at least a part of emission light at the principal plane, to thereby lead reflected light, refracted light, or diffracted light, of emission light of the surface-emitting type semiconductor laser, to the photodetector. As a result, the amount of output light of the optical module and the amount of light monitored at the photodetector element can be stabilized.

In an optical module in accordance with an exemplary aspect of the present invention, the surface-emitting type semiconductor laser can be disposed such that angles of the two polarization axes of emission light, with respect to the polarization axis of the optical member, are equal to each other. As a result, polarized light in an axial direction, that is located in the middle of the two preferentially oriented polarization axes, has few fluctuations in the amount of light due to a mode competition. Therefore a light source with substantially reduced noise can be realized.

In an optical module in accordance with an exemplary aspect of the present invention, the surface-emitting type semiconductor laser can emit polarized light, preferentially oriented in two axes, along a cleavage plane of a semiconductor substrate. As a result, there is realized a light source equipped with a surface-emitting type semiconductor laser having two preferential polarization axes that depend on the crystal orientation of the semiconductor substrate.

In an optical module in accordance with an exemplary aspect of the present invention, the surface-emitting type semiconductor laser can include a resonator structure having at least a part of a planar configuration thereof that is circular or square. For example, the resonator may include a pair of mirrors, and one of the mirrors can be formed in a circular shape or a square shape. As a result, the resonator has an isotropic planar configuration. Therefore there is realized a light source having a surface-emitting type semiconductor laser whose emission light has polarization axes that depend on the crystal orientation of the semiconductor substrate.

The optical module described above can be applied to optical transmission devices used in LAN and SAN, for example.

DETAILED DESCRIPTION OF EXEMPLARY EMBODIMENTS

Exemplary embodiments of the present invention will be described below with reference to the accompanying drawings.

1. First Optical Module

Figure 1:
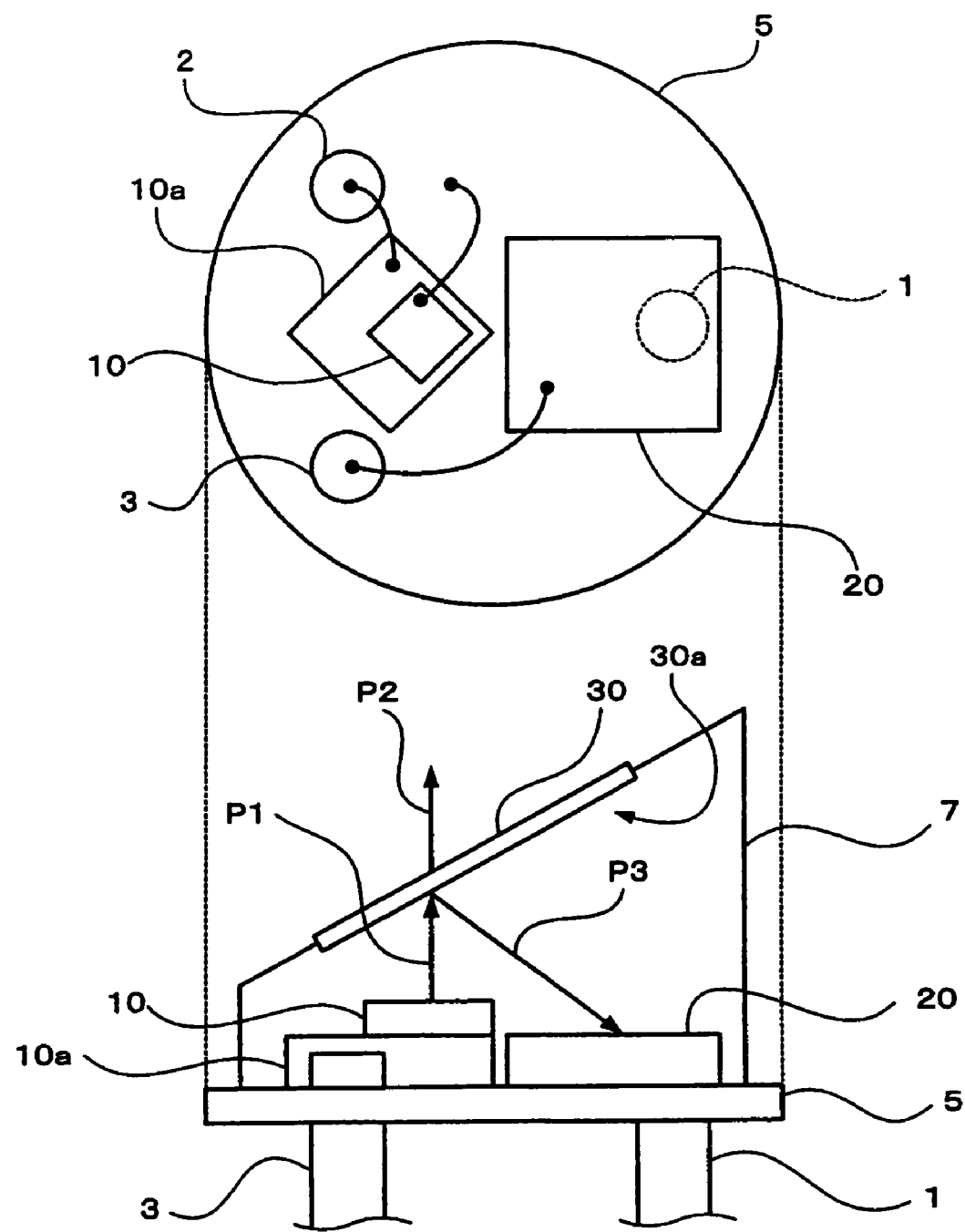
FIG. 1 is a schematic showing a first optical module in accordance with an exemplary embodiment of the present invention.

FIG. 1 schematically shows a first optical module in accordance with an exemplary embodiment of the present invention.

The optical module of the present exemplary embodiment includes a metal stem 5, and a vertical resonator type surface-emitting type semiconductor laser (a light emitting element in a broad sense: hereafter VCSEL) 10 electrically connected to the metal stem through a VCSEL submount (simply, a submount in a broad sense) 10a composed of ceramics and a metal film formed thereon (to secure insulation from the stem 5). Furthermore, a monitor PD (a photodetector in a broad sense) 20 to monitor the amount of emission light of the VCSEL 10 is disposed on the stem 5.

Also, the optical module of the present exemplary embodiment includes lead pins 1–3 for mutual transmission and reception of electrical signals with external devices. By using them, the VCSEL 10, the VCSEL submount 10a and the monitor PD 20 are electrically connected by wire bonding.

Figure 2:
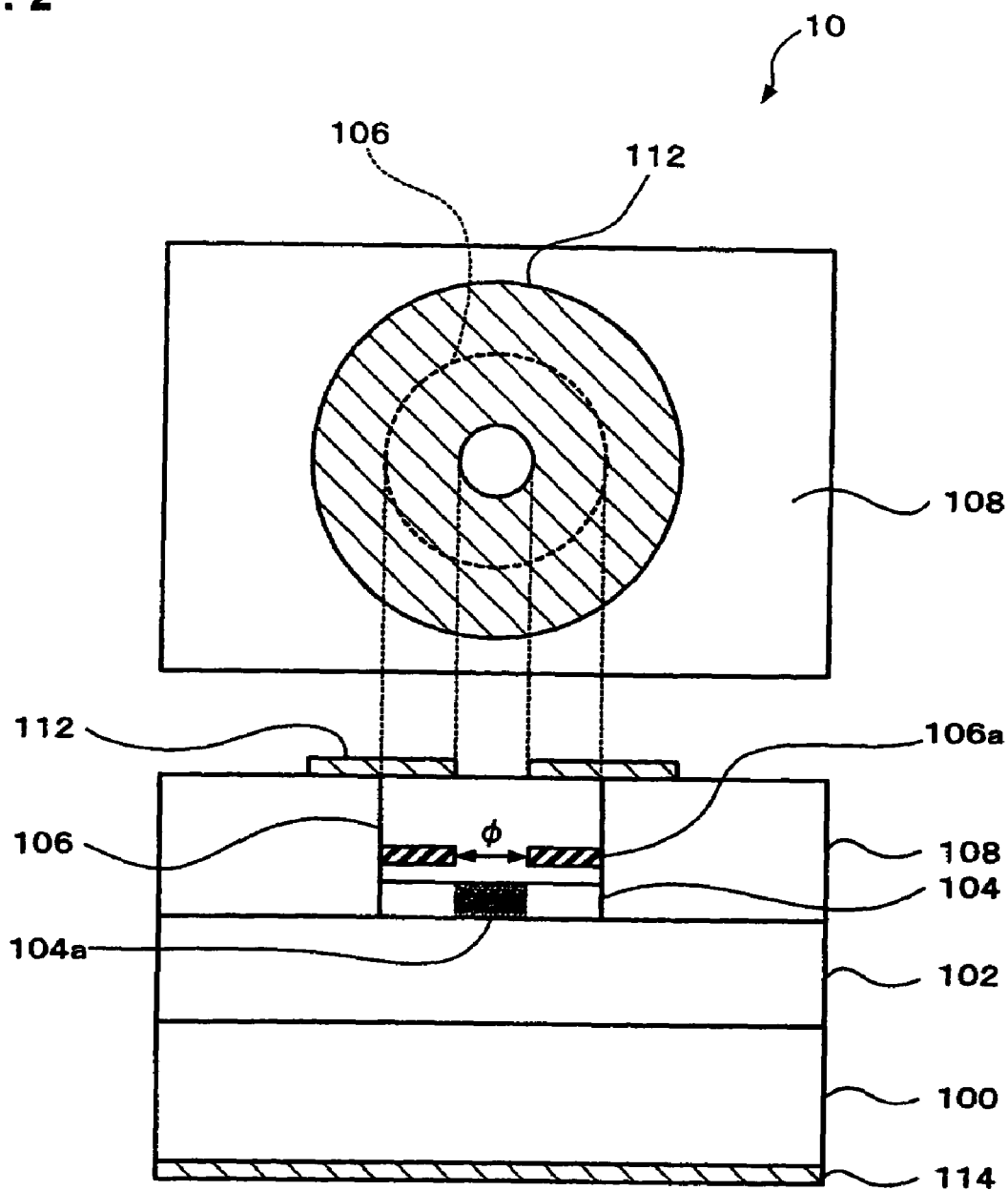
FIG. 2 is a schematic showing a surface-emitting type semiconductor laser suitable for an optical module in accordance with an exemplary embodiment of the present invention.

As the VCSEL 10, one that can obtain linearly polarized light in two given polarization axes (first and second polarization axes in a broad sense) can be used. Specifically, the VCSEL 10 has a resonator structure in which a lower mirror (multilayer reflection film) layer 102, an active layer 104, and an upper mirror (multilayer reflection film) layer 106 formed with GaAs/AlGaAs type compound semiconductor materials are stacked in layers on an n-type GaAs substrate 100 in the (100) crystal plane, as shown in FIG. 2. It is noted that the reference numeral 108 denotes a dielectric layer composed of an oxide film.

Also, reference numerals 112 and 114 in FIG. 2 denote a p-type electrode and an n-type electrode, respectively. Further, the VCSEL 10 has a current constricting layer 106a formed through oxidation of an internal part of an upper mirror layer 106. In the VCSEL 10, the density of an electrical current to be injected in the active layer 104 is controlled by the diameter of the current constricting layer 106a, such that the diameter of the active region 104a (emission region) is made to have a diameter suitable for the multimode oscillation ($8^{-4}$ m or more, for example). Instead of providing the current constricting layer 106a, the diameter of the active layer 104 may be processed to a diameter with which a multimode oscillation is generated. Also, in the VCSEL 10, the active layer 104 and the upper mirror layer 106 are formed in a circular configuration by anisotropic etching, to assume a circular resonator structure. In the resonator having such an isotropic configuration, the polarization characteristic of emission light depends on (is preferentially oriented in) the crystal orientation of the substrate. Specifically, when the (100) crystal plane is used, emission light has polarization predominant axes (in a broad sense, polarization axes) that can obtain strong linear polarization (a large amount of light) in mutually orthogonal two directions of the [011] and [0—11] axes. The polarization axes of the emission light are preferentially oriented in directions of the cleavage plane of the substrate (in a broad sense, in two specific crystal orientations). In addition, if an emission aperture of the p-type electrode 112 that is formed on the resonator is formed to have isotropy, the density of an electric current injected into the resonator is uniformly distributed, such that the dependency of the polarization predominant axes of the VCSEL 10 on the direction of the cleavage plane of the substrate strengthens. It is noted that the polarization predominant axes may not necessarily be perpendicular to each other.

Figure 3:
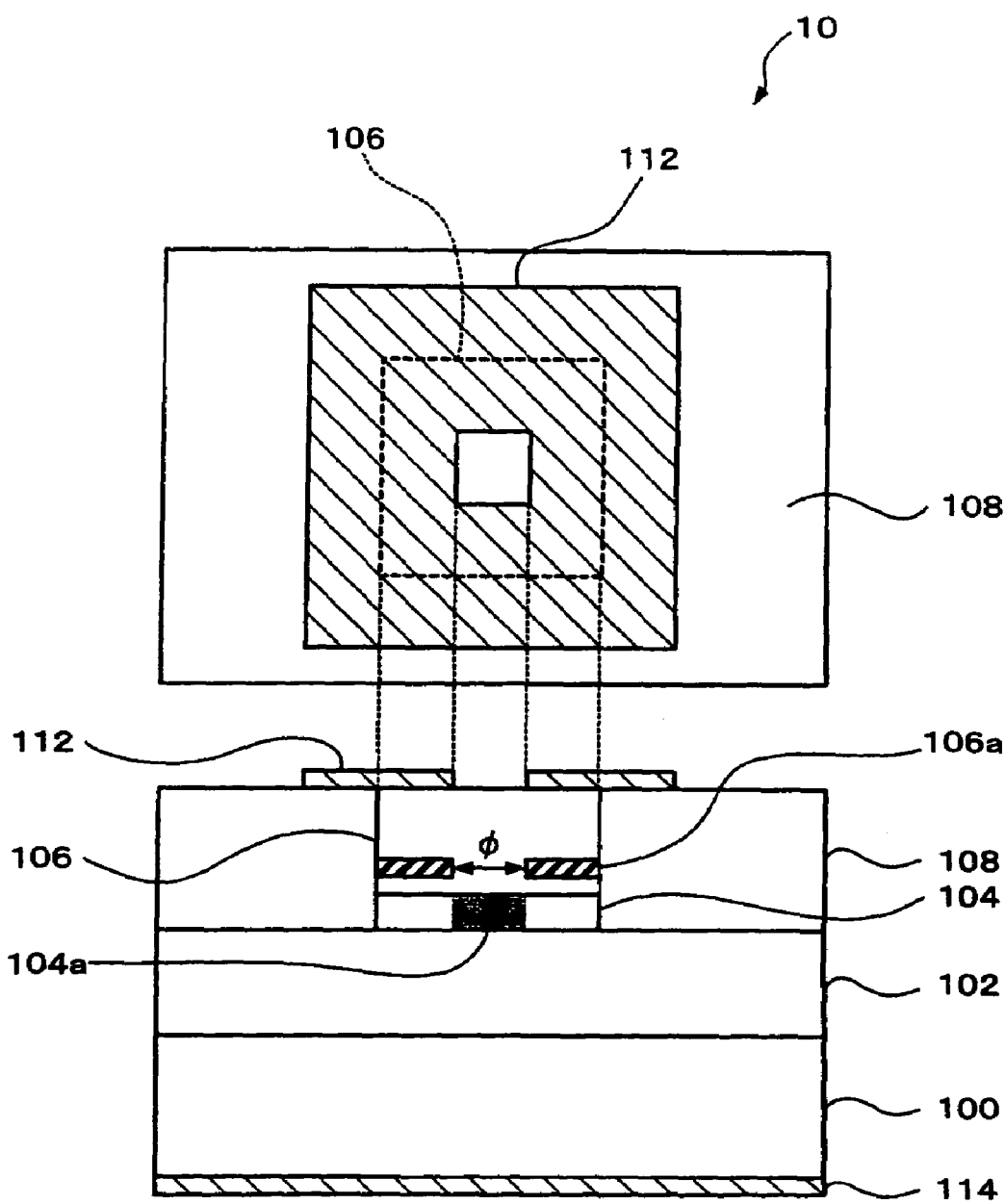
FIG. 3 is a schematic showing a surface-emitting type semiconductor laser suitable for an optical module in accordance with an exemplary embodiment of the present invention.

Also, the resonator structure of the VCSEL is not limited to a circular shape, and the planar configuration of the resonator structure may be square (in a broad sense, rectangular), as shown in FIG. 3, for example. By so doing, it is considered that, because the isotropy is given in two directions along the sidewall of the resonator, stronger dependence of its polarization axes upon the cleavage direction is demonstrated, compared to that of the circular resonator structure. In this case, if the p-type electrode 112 is formed to have a square emission aperture, preferential orientation control of the polarization axes becomes possible also in view of the density distribution of the injection current.

Figure 4:
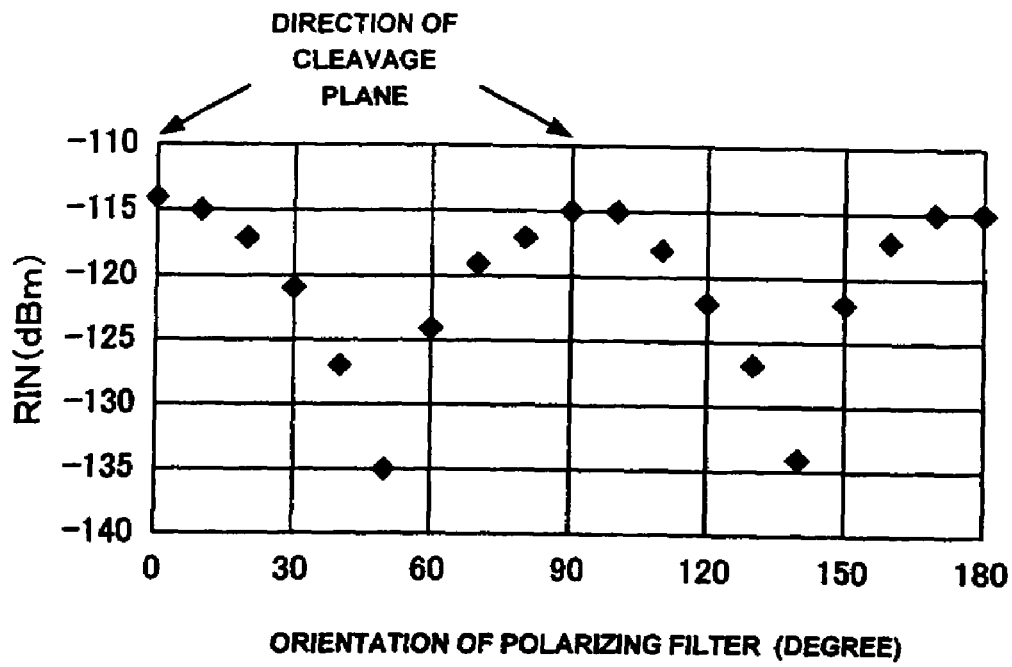
FIG. 4 is a graph showing the polarization dependence of emission light of a surface-emitting type semiconductor laser in accordance with an exemplary embodiment of the present invention.

It is noted here that, the inventors of the present application measured the dependency of the angle of polarization of emission light of the VCSEL 10 by using a polarizing filter. FIG. 4 shows the relative intensity noise (RIN) of emission light of the VCSEL 10 when measured with 937.5 MHz as a noise characteristic, which is in a band used in a gigabit ISA network (GbE). The measurements were made with one of the cleavage plane directions of an n-type GaAs substrate 100 as a reference (0 degree). According to FIG. 4, the noise is large in the cleavage plane directions, and it is confirmed that the noise decreases sharply at an intermediate angle between the two cleavage plane directions [011] and [0—11]. It is understood that the emission light of the VCSEL 10 has two polarization predominant axes which are preferentially oriented in the cleavage directions.

Moreover, as the monitor PD 20, a related art photodetector element, such as, a PN photo-diode, a PIN photo-diode, etc. which uses semiconductor, such as Si, Ge, etc. or compound semiconductor (a GaAs type, InP type) can be used. Specifically, one having a photo-detecting wavelength band which suites the oscillation wavelength of the VCSEL 10 is used.

Moreover, in the optical module of the present exemplary embodiment, the VCSEL 10, the VCSEL submount 10*a* and the monitor PD 20 described above, are enclosed inside the metallic container 7 that is connected to (or formed in one piece with) the stem 5. The container 7 is disposed in a manner such that a reflection mirror (in a broad sense, an optical member) 30, that has polarization selectivity as an emission window of the emission light of the VCSEL 10 and is provided above the VCSEL 10 and the monitor PD 20, intersects with a traveling direction of the emission light P1 of the VCSEL 10. The reflection mirror 30 has a reflection surface 30*a* in which a reflection film formed with a metal film (a single-layer or a multilayer) or a dielectric film (a single-layer or a multilayer) is formed on one surface (in a broader sense, a principal plane) of a glass plate. The reflection surface 30*a* has P-polarization whose transmittance is higher than that of S-polarization, and has a prescribed polarization transmission axis (in a broad sense, a third polarization axis). When the reflection film is made of a multilayer, the transmittance of light in the reflection surface 30*a* is determined by the thickness, material, etc. of the reflection film, and depends on the number of layers. The reflection mirror 30 transmits a part of the emission light P1 of the VCSEL 10, and outputs the same as output light P2, and reflects the remaining of the light, and directs (injects) the same as monitor light P3 into the monitor PD.

Next, the arrangement relation between the VCSEL 10 and the reflection mirror 30 will be described.

Figure 5:
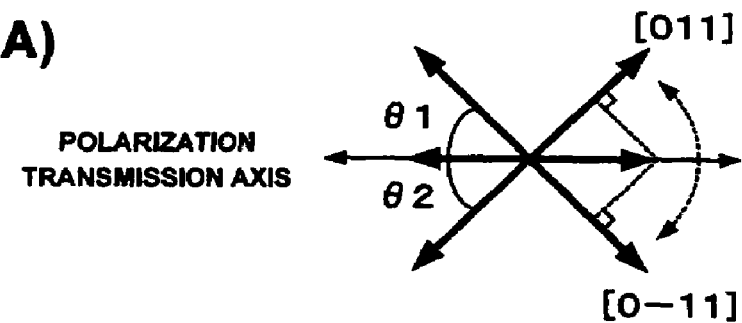
FIGS. 5(A) and 5(B) are schematics for explaining the arrangement relation between a surface-emitting type semiconductor laser in accordance with an exemplary embodiment of the present invention and a reflection mirror.
Figure 5:
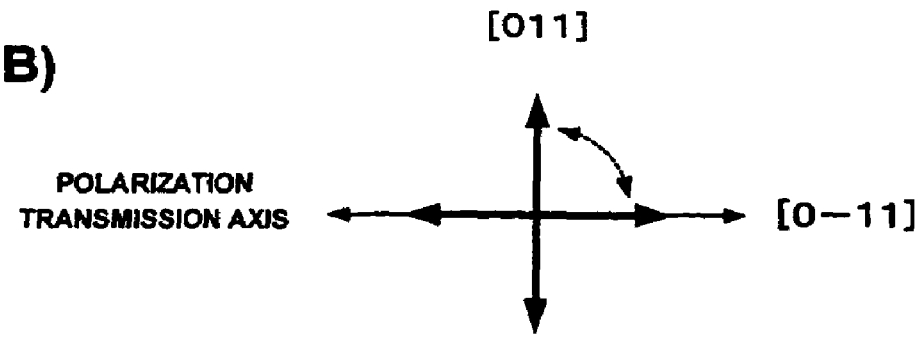

In accordance with the present exemplary embodiment, noise reduction of the optical module is achieved by giving a certain arrangement relation between the two polarization predominant axes of emission light of the VCSEL 10 and the polarization transmission axis of the reflection mirror 30. Specifically, the two polarization predominant axes of the VCSEL 10 along the substrate cleavage plane directions ([011] and [0—11]) are arranged so that neither of them overlaps with the polarization transmission axis of the reflection mirror 30. As a result, linearly polarized light of relatively low noise shown in FIG. 4 can be securely retrieved from the reflection mirror 30. Moreover, in view of the tolerance against fluctuations in the amount of output light and the amount of monitor light by a mode competition, as shown in FIG. 5(A), an angle θ1 and an angle θ2 of the two polarization predominant axes of the VCSEL 10, defined with respect to the polarization transmission axis of the reflection mirror 30, may be arranged to be equal to each other (for example, 45 degrees) so that each can be at an intermediate position between the orthogonal cleavage plane directions of the substrate. As shown in FIG. 5(B), when one of the two polarization predominant axes of the VCSEL 10 is arranged to match the polarization transmission axis of the reflection mirror 30, it is obvious from FIG. 4 that, when a mode competition occurs, the amount of output light of the optical module and the amount of monitor light to the monitor PD20 fluctuate greatly.

As described above, according to the optical module of the present exemplary embodiment, because the VCSEL 10 oscillates in a multimode, its emission light has low coherency, and degradation of the S/N ratio by the mode selection loss is few even when a multimode fiber is used. Moreover, the two polarization predominant axes of emission light of the VCSEL 10 are arranged so as not to overlap with the polarization transmission axis of the polarization plane 30*a* of the reflection mirror 30, such that, even when a mode competition occurs, fluctuations in the amount of light that passes the reflection mirror 30 and the amount of light that is reflected by the reflection mirror 30 are few. For this reason, the optical module of the present exemplary embodiment can realize a light source with low noise which is suitable for communication forms using multimode fibers.

Moreover, because neither the amount of transmitted light or the amount of reflected light in the reflection mirror 30 fluctuates easily, even when a mode competition occurs, the light amount of output light P2 of the optical module and the light amount of monitor light P3 to the monitor PD20 can be stabilized according to the present exemplary embodiment.

In particular, by arranging the VCSEL 10 with respect to the reflection mirror 30 in a manner that the angle $θ_1$ and the angle $θ_2$ of the respective two polarization predominant axes of the VCSEL 10, defined with respect to the polarization transmission axis of the reflection mirror 30, are equal to each other, the polarized light in an axial direction located in the middle of the two polarization predominant axes has few fluctuations in the amount of light due to a mode competition. Therefore a light source with substantially reduced noise can be achieved.

Figure 6:
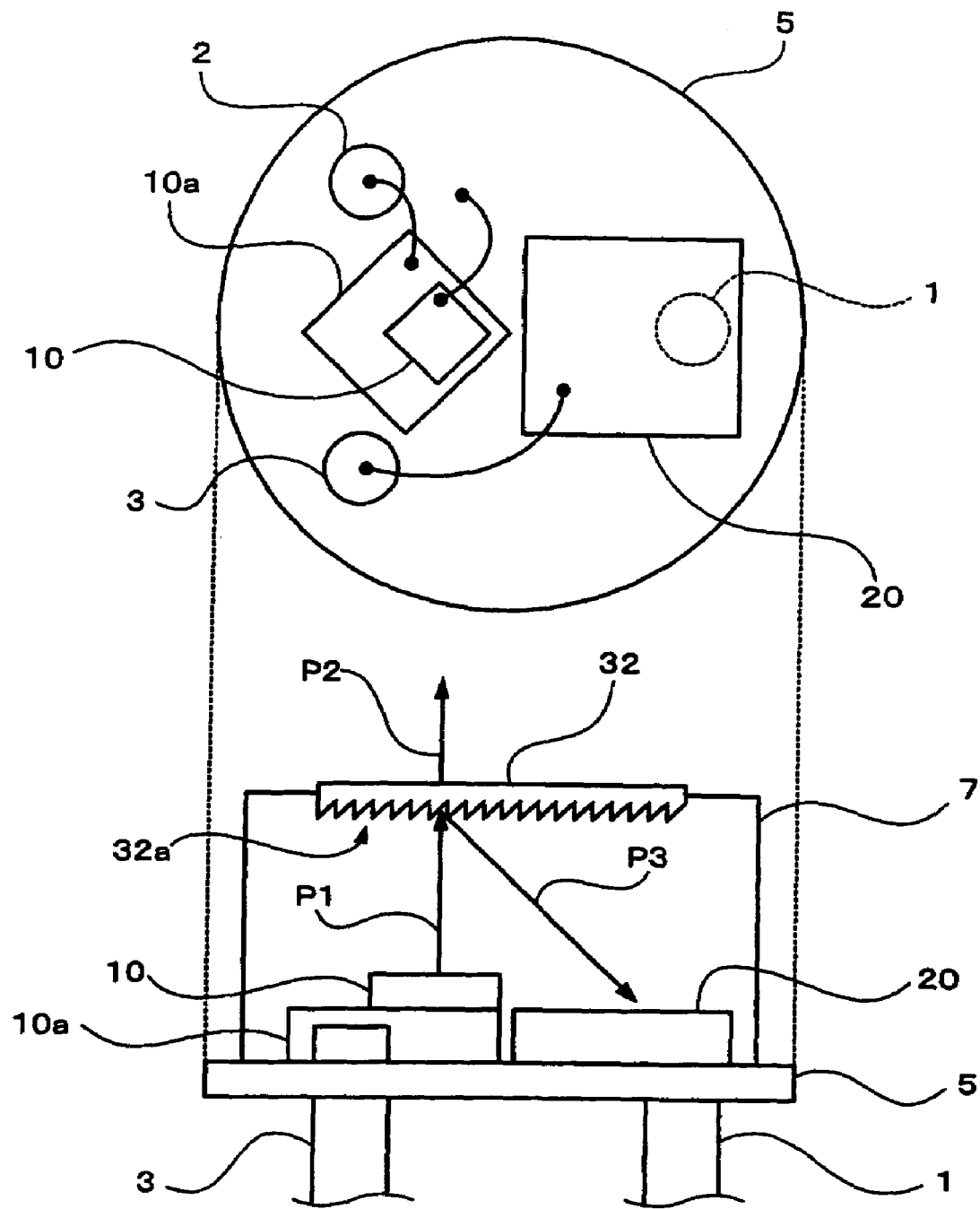
FIG. 6 is a schematic showing a variation example of the first optical module in accordance with an exemplary embodiment of the present invention.

It is noted that a diffraction grating (in a broad sense, an optical member) 32 may be used instead of using the reflection mirror 30, as shown in FIG. 6, as a variation example of the first optical module. When the diffraction grating 32 is used, the diffraction grating 32 is also disposed above the VCSEL 10 such that one of its planes (in a broad sense, a principal plane) 32*a* intersects with emission light P1 of the VCSEL 10. Moreover, in this case, the arrangement of the diffraction grating 32 and the monitor PD 20 is decided so that a first order diffracted light (in a broad sense, a low-order diffracted light) is led to the monitor PD 20. Because the diffraction grating 32 has polarization selectivity along the directions of its lattice, the optical module of this variation example, like the optical module shown in FIG. 1, can provide linearly polarized light with low noise as output light P2, which is suitable for communication forms that use multimode fibers. Moreover, the tolerance against fluctuations in the light amount of output light P2 and monitor light P3 caused by a mode competition can be enhanced. Moreover, in accordance with the present exemplary embodiment, a composition to lead light to the monitor PD 20 by using optical diffraction may be adopted, besides the one using transmission, reflection or refraction.

2. Second Optical Module

Figure 7:
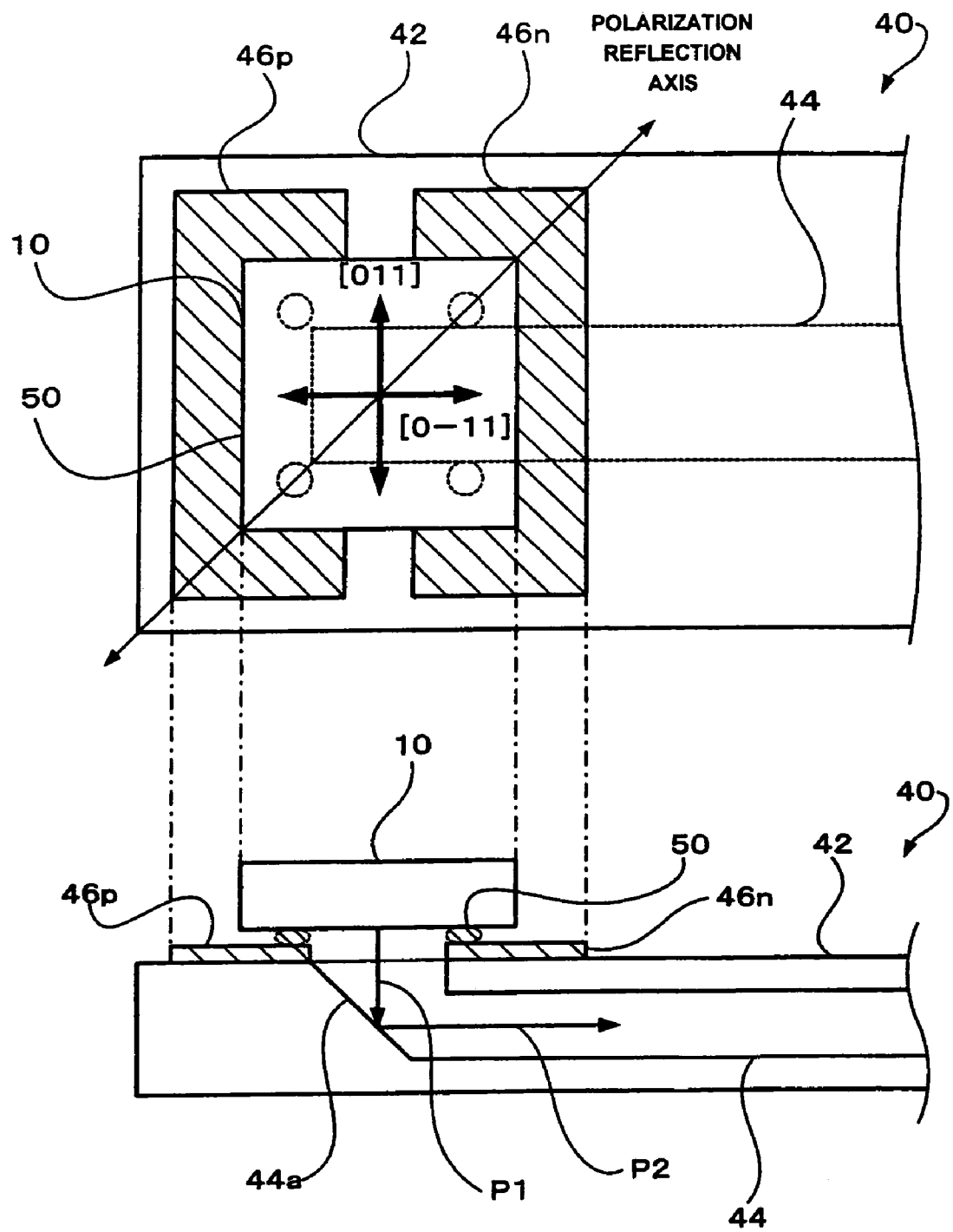
FIG. 7 is a schematic showing a second optical module in accordance with an exemplary embodiment of the present invention.

FIG. 7 is a schematic showing a second optical module in accordance with a second exemplary embodiment of the present invention.

This optical module is formed from a VCSEL 10 and an optical guide element of an optical waveguide type (in a broad sense, an optical member) 40. The VCSEL 10 can adopt the structure shown in, for example, FIG. 2 or FIG. 3, like the first optical module described above. Therefore its detailed description is omitted.

The optical guide element 40 has an optical waveguide structure formed from a core 44 and a clad 42 that is composed of a material with a low refractive index than that of the core 44. When this optical module is used, a multimode fiber will be connected to a tip of the optical light guide element 40. Furthermore, the optical guide element 40 has a reflection surface (in a broad sense, a principle plane) 44*a* that is arranged to intersect with a traveling direction of emission light P1 of the VCSEL 10, and has a polarization reflection axis (in a broad sense, a polarization axis) with which S-polarization has a high reflecting power. In other words, in the second optical module, emission light P1 of the VCSEL 10 is reflected by the reflection surface 44*a* and reflected light P2 is led to the core 44. Moreover, on the surface of the clad 42, an electrode section 46p for a p-type electrode and an electrode section 46n for an n-type electrode are provided, and, for example, the VCSEL 10 is flip-chip mounted with bumps 50 in a face down state. Specifically, this optical module receives electrical signals inputted from outside through the electrode sections 46p and 46n and operates. The core 44 and the clad 42 can be formed by using materials selected from any suitable materials used as materials for thin-film optical waveguides, silica glass optical fibers, plastic optical fibers, and the like, for example. As the materials used for thin-film optical waveguide, silicon oxide ($SiO_2$), lithium niobate ($LiNbO_3$), and the like can be listed. As the materials used for silica glass optical fibers, oxide glass represented by the above-mentioned silicon oxide, heavy metal fluoride glass ($ZrF_4$—$BaF_2$), the chalcogenide glass (As—S, As—Ge—Se, Ge—S), and the like can be listed. As the materials used for plastic optical fibers, polymethyl methacrylate (PMMA), epoxy resin, phenol resin, diallylphthalate, phenyl methacrylate, fluorine polymer, and the like can be listed.

Furthermore, in the optical module of the present exemplary embodiment, as shown in FIG. 7, two polarization predominant axes along cleavage plane directions ([011], [0—11]) of the VCSEL 10 are disposed so as not to overlap the polarization reflection axis of the reflection surface 44a of the optical guide element 40. As a result, light P2, that passes the inside of the core 44 that composes the optical waveguide, becomes linearly polarized light with low noise, and with few fluctuations in the amount of light due to a mode competition.

Accordingly, the second optical module can also provide linearly polarized light with low noise as output light, which is suitable for communication forms that use multimode fibers, and the tolerance against fluctuations in the light amount of output light caused by a mode competition can be enhanced.

3. Optical Transmission Device

Figure 8:
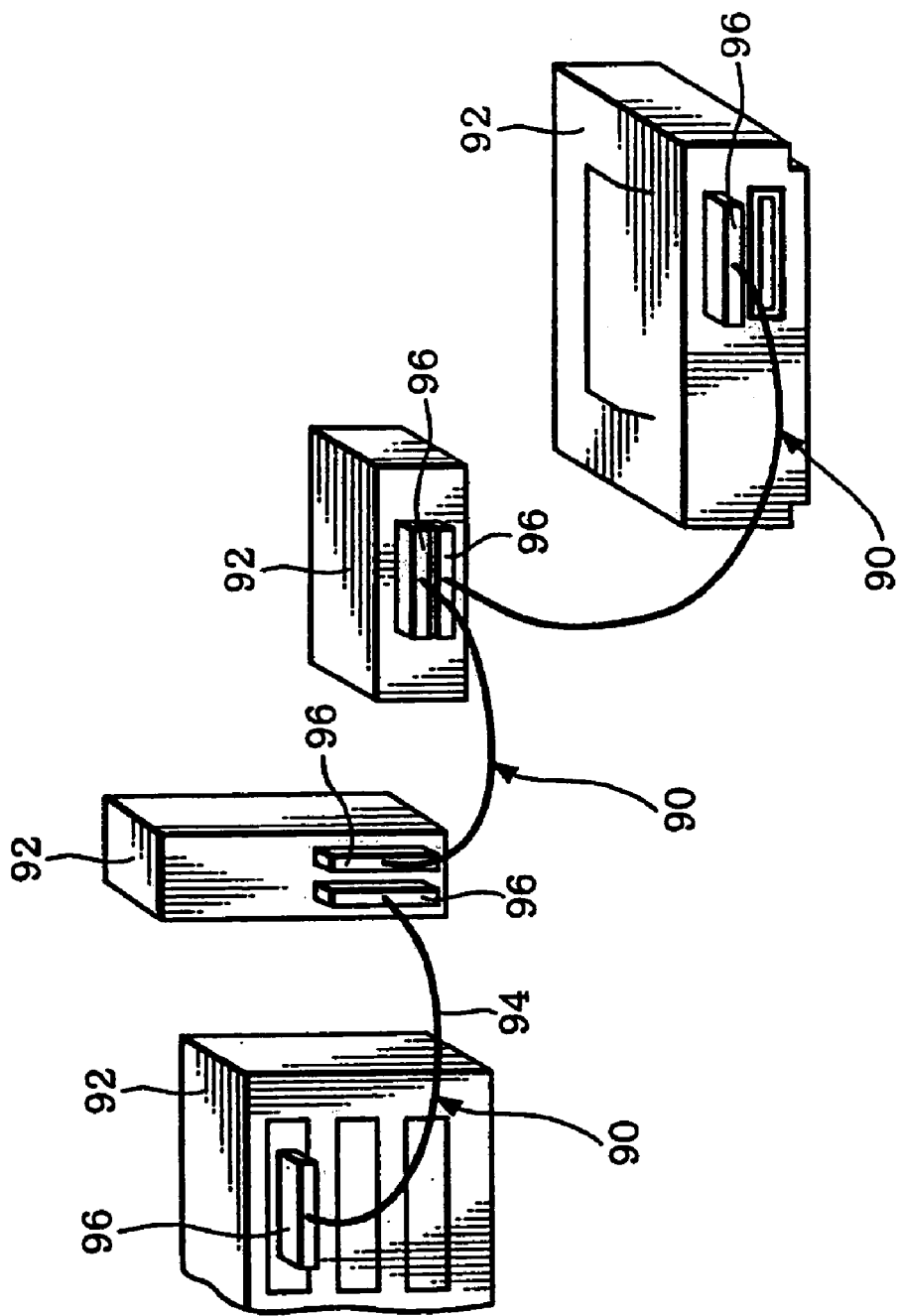
FIG. 8 is a schematic showing optical transmission devices in accordance with an exemplary embodiment of the present invention.

FIG. 8 is a schematic showing optical transmission devices that use optical modules in accordance with an exemplary embodiment of the present invention.

The optical transmission devices 90 mutually connect electronic devices 92, such as, a computer, display device, storage device, printer and the like. The electronic devices 92 may be information communication devices. The optical transmission device 90 may include a cable 94 and plugs 96 provided on both sides of the cable 94. Specifically, the cable 94 is a multimode fiber. The plug 96 is composed by including an optical module of the present exemplary embodiment as a light source for optical transmission. With the optical transmission devices, data can be transmitted among the electronic devices by optical signals.

Electronic devices that are mutually connected by optical transmission devices of the present exemplary embodiment can include liquid crystal display monitors, digital CRTs (which may be used in the fields of finance, mail order, medical treatment, and education), liquid crystal projectors, plasma display panels (PDP), digital TVs, cash registers of retail stores (for POS), videos, tuners, gaming devices, and the like.

Exemplary embodiments of the present invention have been described above. But the present invention is not limited to the exemplary embodiments described above. Many modifications can be made in accordance with modified exemplary embodiments within the scope of the subject matter of the prevent invention. For example, the material that composes each layer of the VCSEL 10 is not limited to a GaAs material, but may be a compound semiconductor material of InP, GaN, or the like.

What is claimed is:

1. An optical module, comprising:
   a surface-emitting type semiconductor laser that emits polarized light oscillating in a multimode which is oriented in two given polarization axes; and
   an optical member that demonstrates at least one function among a transmission function, a reflection function, a refraction function, and a diffraction function alternatively to a predetermined polarization, the optical member being disposed such that a principal plane thereof intersects with a traveling direction of emission light of the surface-emitting type semiconductor laser, and
   the surface-emitting type semiconductor laser being arranged such that the two polarization axes of emission light do not overlap with a polarization axis of the optical member, the surface-emitting type semiconductor laser emitting polarized light oriented in two axes along a cleavage plane of a semiconductor substrate.

2. The optical module according to claim 1, further comprising:
   a photodetector that receives at least a part of emission light of the surface-emitting type semiconductor laser, the optical member reflecting, refracting or diffracting, at least a part of emission light at the principal plane, to thereby lead reflected light, refracted light, or diffracted light of emission light of the surface-emitting type semiconductor laser to the photodetector.

3. The optical module according to claim 1, the surface-emitting type semiconductor laser being arranged such that angles of the two polarization axes of emission light with respect to the polarization axis of the optical member are equal to each other.

4. The optical module according to claim 1, the surface-emitting type semiconductor laser including a resonator structure having at least a part of a planar configuration thereof that is substantially a circle or square.

5. An optical transmission device, comprising:
   the optical module according to claim 1.

6. The optical module according to claim 1, the optical member being a reflection mirror, a reflection surface of the reflection mirror having a metal film or a dielectric film.

7. The optical module according to claim 6, the reflection surface having P-polarization whose transmittance is higher than that of S-polarization.

8. The optical module according to claim 3, the angles of the two polarization axes of emission light with respect to the polarization axis of the optical member being 45 degrees.

9. The optical module according to claim 2, the optical member being a diffraction grating, a low-order diffracted light is lead to the photo detector.

10. The optical module according to claim 1, further comprising:
    an optical guide element including an optical wave guide structure formed of a core and a clad, the optical member being arranged at the optical guide element.

11. The optical guide module according to claim 1, further comprising:
    an optical guide element, a P-type electrode and a N-type electrode formed on the surface of the optical guide element.

12. The optical guide module according to claim 1, further comprising:
    an optical guide element, the surface emitting type semiconductor laser being flip chip mounted with the optical guide element in a face-down state.

13. An optical module, comprising:

a surface-emitting type semiconductor laser that emits polarized light oscillating in a multimode which is oriented in two given polarization axes; and an optical member that demonstrates at least one function among a transmission function, a reflection function, a refraction function, and a diffraction function alternatively to a predetermined polarization, the optical member being disposed such that a principal plane thereof intersects with a traveling direction of emission light of the surface-emitting type semiconductor laser, and the surface-emitting type semiconductor laser being arranged such that the two polarization axes of emission light do not overlap with a polarization axis of the optical member, the surface-emitting type semiconductor laser including:

a substrate;

a resonator structure formed on the substrate, the resonator structure having a lower mirror layer, an active layer and upper mirror;

a mesa extending downward through the semiconductor layers at least to the active layer; and an upper electrode above the upper minor, the mesa having a planar configuration that defines at least one of a circle and a square.

* * * * *